US007418573B2

(12) United States Patent
Ozawa

(10) Patent No.: US 7,418,573 B2
(45) Date of Patent: Aug. 26, 2008

(54) ADDRESS GENERATION APPARATUS AND OPERATION APPARATUS

(75) Inventor: Kunihiko Ozawa, Tokyo (JP)

(73) Assignee: Sony Corporation (JP)

( * ) Notice: Subject to any disclaimer, the term of this patent is extended or adjusted under 35 U.S.C. 154(b) by 336 days.

(21) Appl. No.: 11/116,352

(22) Filed: Apr. 28, 2005

(65) Prior Publication Data

US 2005/0254338 A1    Nov. 17, 2005

(30) Foreign Application Priority Data

May 11, 2004  (JP)  ............................. 2004-141613

(51) Int. Cl.
*G06F 9/26* (2006.01)
*G06F 12/00* (2006.01)
*G11C 5/00* (2006.01)

(52) U.S. Cl. ........................ 711/217; 711/220; 365/236

(58) Field of Classification Search .................. 711/217
See application file for complete search history.

(56) References Cited

U.S. PATENT DOCUMENTS 6,233,669 B1 *  5/2001  Scott et al. .................. 711/219

FOREIGN PATENT DOCUMENTS

JP      2002-215388     8/2002

* cited by examiner

*Primary Examiner*—Reginald G. Bragdon
*Assistant Examiner*—Eric Loonan
(74) *Attorney, Agent, or Firm*—Rader Fishman & Grauer PLLC; Ronald P. Kananen

(57) ABSTRACT

An address generation apparatus and an operation apparatus are shown to generate a complex address and to suppress an increase of a mounted area even if a bit width of a counter is widened. An address generation apparatus has at least one counter setting a count value by an operated value, at least one operation section being arranged corresponding to the counter respectively, operating a supplied step value and a count value of the corresponding counter in response to a control signal and supplying the operated count value to the corresponding counter, a selection section selecting either a set value or the operation result of the operation section in response to a control signal and inputting it to the counter, and an address operation section performing an operation in response to a control signal for the count value of the counter and outputting the operation result as an address.

10 Claims, 15 Drawing Sheets

FIG. 7A ACNTV31
FIG. 7B ACNTV32
FIG. 7C MDV307
FIG. 7D ADR

FIG. 11

| | | |
|---|---|---|
| 11 | 2 | |
| 10 | 1 | |
| 9 | 0 | |
| 8 | 3 | |
| 7 | 2 | |
| 6 | 1 | |
| 5 | 0 | |
| 4 | 2 | |
| 3 | 1 | |
| 2 | 0 | |
| 1 | 1 | |
| 0 | 0 | |

504

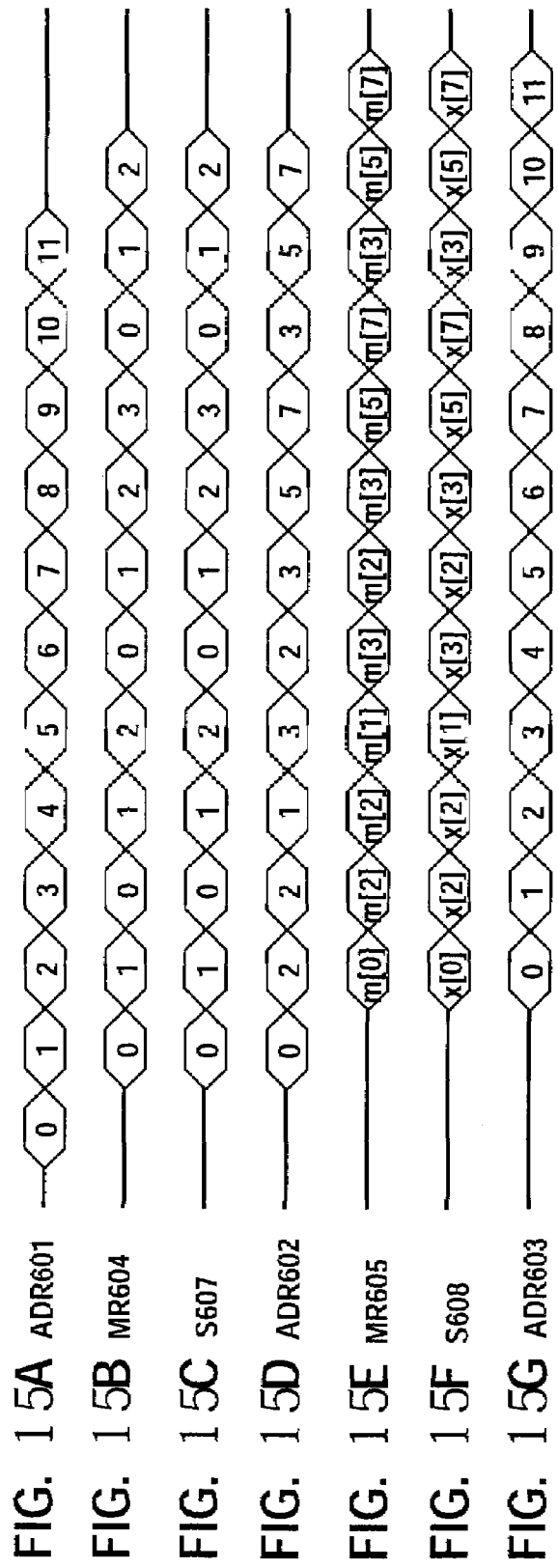

ADDRESS GENERATION APPARATUS AND OPERATION APPARATUS

CROSS REFERENCES TO RELATED APPLICATIONS

The present invention contains subject matter related to Japanese Patent Application JP 2004-141613 filed in the Japanese Patent Office on May 11, 2004, the entire contents of which being incorporated herein by reference.

BACKGROUND OF THE INVENTION

1. Field of the Invention

The present invention relates to an address generation apparatus applicable to an operation system and a reconfigurable operation apparatus to which this address generation apparatus is applied.

2. Description of the Related Art

A general operation system has, for example, a CPU, an address generation apparatus, a plurality of configuration information memory and a reconfigurable operation apparatus.

In this operation system, a selection of a plurality of the configuration information memory is controlled by using the CPU.

In this case, the selection of the memory is performed by using the CPU during the period that the address generation apparatus generates an address.

In a DSP and so on in the related art, an address pattern to be generated is limited to a simple pattern such as for a loop of the C language. When performing a complex access, an address generated automatically was insufficient and it was necessary to perform the address calculation by using, for example, an ALU of the DSP.

Therefore a, cycle number necessary for the processing is more inefficient than that of the automatic address generation.

For improving this, an address generation apparatus using, for example, a counter has been proposed (refer to Japanese Unexamined Patent Publication (Kokai) No. 2002-215388).

SUMMARY OF THE INVENTION

However, it suffered from a disadvantage that it was inefficient or it was difficult to generate the address when generating a complex address even when the address generation apparatus described in Japanese Unexamined Patent Publication (Kokai) No. 2002-215388 is used.

Further, it suffered from a disadvantage that it was necessary to enlarge a bit width of the counter because the address range was widened, and an area was enlarged when mounted on an LSI.

It is desirable to provide an address generation apparatus and an operation apparatus able to generate a complex address efficiently and able to suppress an increase of the mounted area even when the bit width of the counter is widened.

According to a first aspect of the present invention, there is provided an address generation apparatus generating an address of a memory, and the address generation apparatus has at least one counter setting a count value by an operated value, at least one operation section being arranged corresponding to the counter, operating a supplied step value and a count value of the corresponding counter in response to a control signal and supplying the operated count value to the corresponding counter, a selection section selecting either a set value or the operation result of the operation section in response to a control signal and inputting it to the counter, and an address operation section performing an operation in response to a control signal for the count value of the counter and outputting the operation result as an address.

Preferably, the address generation apparatus of the present invention has a plurality of the counters and operation sections, and has a control section enabling to make a part of the counters operate with dividing them by a control signal, or enabling to make a plurality of counters operate with coupling them by a control signal.

Preferably, the address operation section outputs an operated result obtained by operating an input value, a resistor value and an output of a plurality of the counters at the operation section as an address.

Preferably, the operation section performs a calculation of a count value in response to the control signal by using the step value, the count value of the counter and a modification value.

Preferably, the address generation apparatus has a control section enabling to change a start time of the address generation.

Preferably, the control section counts the start time by a part of the counter of a plurality of the counters.

Preferably, the address generation apparatus further has a parameter resistor set an address generation delay value, and a timing counter for starting a count in response to a trigger signal and delaying the address generation until the count becomes the value set in the parameter resistor, wherein the control section makes a count action of the counter effective when the value of the timing counter approaches to the value set in the parameter resistor.

Preferably, the address generation apparatus has a control section enabling to define a validity period of the address generation based on an input of a control signal.

Preferably, a reconfigurable operation apparatus of a second aspect of the present invention has at least a first address generation apparatus, a second address generation apparatus, a third address generation apparatus, a first memory, a second memory, a third memory and an operation apparatus, and the each address generation apparatus has at least one counter setting a count value by an operated value, at least one operation section being arranged corresponding to the counter, operating a supplied step value and a count value of the corresponding counter in response to a control signal and supplying the operated count value to the corresponding counter, a selection section selecting either a set value or the operation result of the operation section in response to a control signal and inputting it to the counter, and an address operation section performing an operation in response to a control signal for the count value of the counter and outputting the operation result as an address, and a readout of the first memory is performed with an address generated by the first address generation apparatus, a readout of the second memory is performed with an address that the second address generation apparatus has generated by using the readout data, and a writing of an operated result that the data read out from the second memory is operated by the operation apparatus, is performed into the third memory with an address generated by the third address generation apparatus.

Preferably, the reconfigurable operation apparatus of a third aspect of the present invention has at least a first address generation apparatus, a second address generation apparatus, a third address generation apparatus, a first memory, a second memory, a third memory, a first operation apparatus and a second operation apparatus, and the each address generation apparatus has at least one counter setting a count value by an operated value, at least one operation section being arranged corresponding to the counter, operating a supplied step value and a count value of the corresponding counter in response to a control signal and supplying the operated count value to the corresponding counter, a selection section selecting either a set value or the operation result of the operation section in response to a control signal and inputting it to the counter, and an address operation section performing an operation in response to a control signal for the count value of the counter and outputting the operation result as an address, and a readout of the first memory is performed with an address generated by the first address generation apparatus, the data read out from the first memory is operated by the first operation apparatus, a readout of the second memory is performed with an address that the second address generation apparatus has generated by using the operated data, and a writing of an operated result that the data read out from the second memory is operated by the second operation apparatus and is performed into the third memory with an address generated by the third address generation apparatus.

According to the present invention, for example, the address generation when the counter is not divided is performed as the followings.

For example, the first operation section and the second operation section perform addition respectively, and transmit the carry of the second operation section to the first operation section to use it without dividing the counter.

The first operation section performs addition by using the carry information and, for example, a step value that is an input value and a count value of the counter.

For example, the first operation section and the second operation section select the input of set value for every predetermined cycle, and select values of the operation result of the first operation section and the second operation section at the time except for the predetermined cycles.

As a result, the count value of a first counter and a second counter takes predetermined values. Then, the address operation section calculates an address based on the value of the first and the second counters.

Further, for example, the address generation when the counter is not divided is performed as the following.

For example, the first operation apparatus and the second operation apparatus perform addition respectively.

For example, the second selection apparatus selects the input of the selection value for every predetermined cycle and selects the result of the second operation apparatus at the time except for the predetermined cycles.

The first selection apparatus for example, constantly selects the value of the first operation apparatus.

As a result, the count values of the first counter and the second counter take predetermined values. Then, the address operation circuit calculates the address based on the counter value of the first and the second counters.

BRIEF DESCRIPTION OF THE DRAWINGS

These and other objects and features of the present invention will become clearer from the following description of the preferred embodiments given with reference to the accompanying drawings, in which:

FIG. 11 is a view showing an example of stored data for every address in the memory in FIG. 10;

DESCRIPTION OF THE PREFERRED EMBODIMENTS

Preferred embodiments of the present invention will be described with reference to the accompanying drawings.

An address generation apparatus according to the present embodiment has a plurality of expressly controllable counters, and the address generation apparatus can set parameters such as an update, an end, a reconfiguration value, a step value, the maximum value, a dividing method, an offset and a start timing of the counter and so on. The address generation apparatus according to the present embodiment can control an address generation by using these parameters.

The address generation apparatus can generate a control signal of a data path and a memory interface control signal in parallel with an address.

First Embodiment

Figure 1:
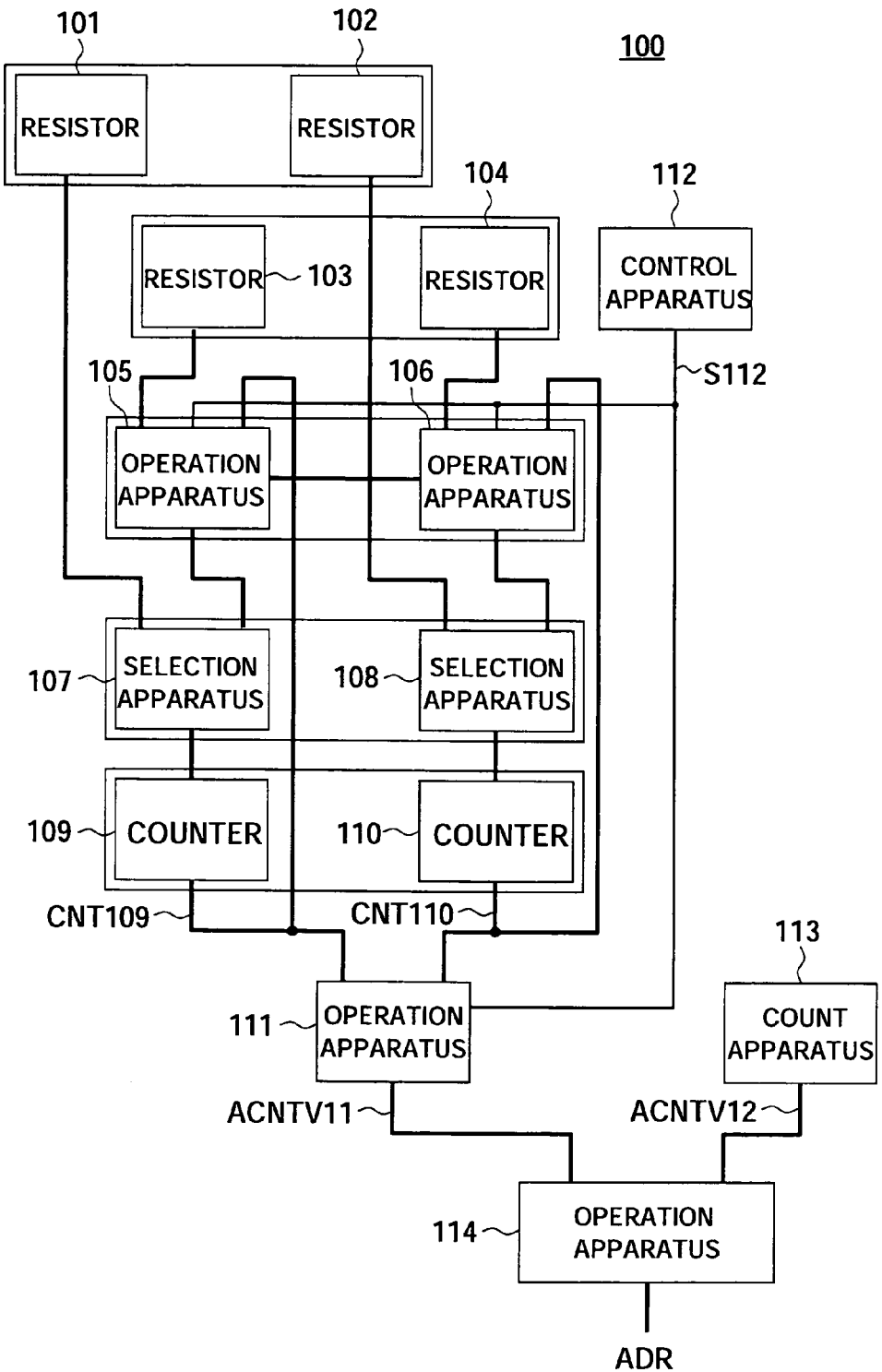
FIG. 1 is a block diagram showing an address generation apparatus according to a first embodiment of the present invention.

FIG. 1 is a block diagram showing an address generation apparatus according to a first embodiment of the present invention.

An address generation apparatus 100 according to the present first embodiment shows a configuration example when a counter is divided or coupled to generate addresses.

The address generation apparatus 100 according to the first embodiment has resistors 101 and 102 for setting an initial value, resistors 103 and 104 for setting a step value, operation apparatuses 105 and 106, selection apparatuses 107 and 108, counters 109 and 110, an operation apparatus 111, a control apparatus 112, a counter apparatus 113 and an operation apparatus 114.

In the address generation apparatus 100 of FIG. 1, the resistors 101 and 102, the resistors 103 and 104, the operation apparatuses 105 and 106, the selection apparatuses 107 and 108, the counters 109 and 110 form a pair respectively and they are possibly used by dividing in a control of a not illustrated control system.

The operation apparatus 105 performs a predetermined operation such as, for example, addition based on a set value of the resistor 103 and a value fed back from the counter 109 in accordance with a control signal S112 showing a dividing state of counters from the control apparatus 112 and an operation result of the operation apparatus 106, and outputs the operation result to the selection apparatus 107.

The operation apparatus 106 performs a predetermined operation such as, for example, addition based on a set value of the resistor 104 and a value fed back from the counter 110 in accordance with a control signal S112 showing a dividing state of counters from the control apparatus 112, and outputs the operation result to the selection apparatus 108.

The selection apparatus 107 selects either a set value of the resistor 101 or an output of the operation apparatus 105 based on a not illustrated control signal, and outputs the operation result to the counter 109.

The selection apparatus 108 selects either a set value of the resistor 102 or an output of the operation apparatus 106 based on a not illustrated control signal, and outputs the operation result to the counter 110.

The counter 109 sets a count value by a set value (initial value) of the resistor 101 selected by the selection apparatus 107 or a value of the operation result of the operation apparatus 105, and outputs the count value CNT109 to the operation apparatus 105 and the operation apparatus 111.

The counter 110 sets a count value by a set value (initial value) of the resistor 102 selected by the selection apparatus 108 or a value of the operation result of the operation apparatus 106, and outputs the count value CNT110 to the operation apparatus 106 and the operation apparatus 111.

The operation apparatus 111 operates count results of the counter 109 and the counter 110 based on the control signal S112 generated by the control apparatus 112, calculates a first address calculation count value ACNTV11 and outputs it to the operation apparatus 114.

The operation apparatus 114 calculates an address ADR based on the first address calculation count value ACNTV11 by the operation apparatus 111 and a second address calculation count value ACNTV12 that is a count result of the counter apparatus 113 performing an action similar to that of the above-mentioned counter.

Here, an address generation action of the address generation apparatus 100 of FIG. 1 when the counter is not divided and an address generation action when the counter is divided will be explained.

First, the address generation action when the counter is not divided will be explained with reference to the timing charts of FIGS. 2A to 2E.

Figure 2:
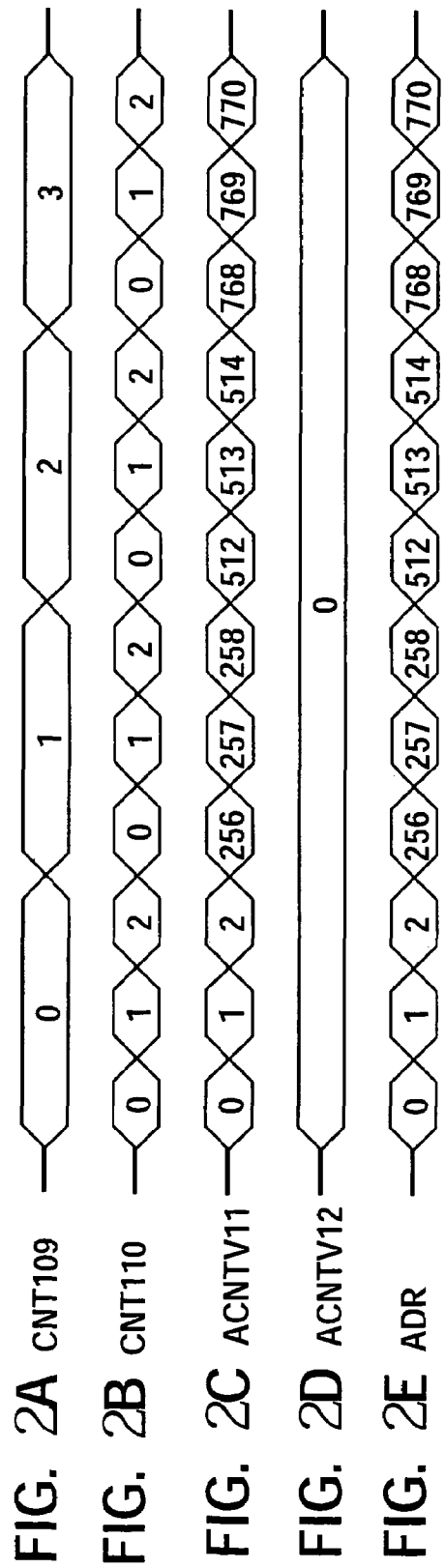
FIGS. 2A to 2E are timing charts for explaining address generation actions when a counter is not divided in the address generation apparatus of FIG. 1.

FIG. 2A shows a count value CNT109 of the counter 109, FIG. 2B shows a count value CNT110 of the counter 110, FIG. 2C shows the first address calculation count value ACNTV11 by the operation apparatus 111, FIG. 2D shows the second address calculation count value ACNTV12 by the counter apparatus 113 and FIG. 2E shows the address ADR calculated in the operation apparatus 114 respectively.

The address generation when the counter is not divided is performed as the followings.

"0" is stored in the resistor 101 and the resistor 102 as the initial value of the counter, and "1" is stored in the resistor 103 and the resistor 104 as the step value.

The operation apparatus 105 and the operation apparatus 106 perform addition respectively, and transfer the carry of the operation apparatus 106 to the operation apparatus 105 to enable use without dividing the counter.

The operation apparatus 105 performs addition by using the carry information, the step value of the resistor 103 that is an input data and the count value CNT109 of the counter 109.

The selection apparatus 107 and the selection apparatus 108 select the values of the resistor 101 and the resistor 102 for every three cycles, and select the values of the operation results of the operation apparatus 105 and the operation apparatus 106 at the time except for the three cycles.

As a result, the count values CNT109 and CNT110 of the counter 109 and the counter 110 take values shown in FIGS. 2A and 2B.

By making it act as mentioned above, the first address calculation count value ACNTV11 and the second address calculation count value ACNTV12 take values shown in FIGS. 2C and 2D.

The operation apparatus 111 performs the following operation by using the output value CNT109 of the counter 109 and the output value CNT110 of the counter 110, and calculates the first address calculation count value ACNTV11.

Counter 109→CNT109

Counter 110→CNT110 (Eq. 1)

Note that, here, an operation of [A, B] is an operation coupling the higher bit and the lower bit.

The operation apparatus 114 performs the following operation with the first address calculation count value ACNTV11 by the operation apparatus 111 and the second address calculation count value ACNTV12 outputted by the counter apparatus 113, and calculates the address ADR.

$$ADR = ACNTV11 + ACNTV12 \qquad \text{(Eq. 2)}$$

Next, the address generation action when the counter is divided will be explained with reference to the timing charts of FIGS. 3A to 3E.

Figure 3:
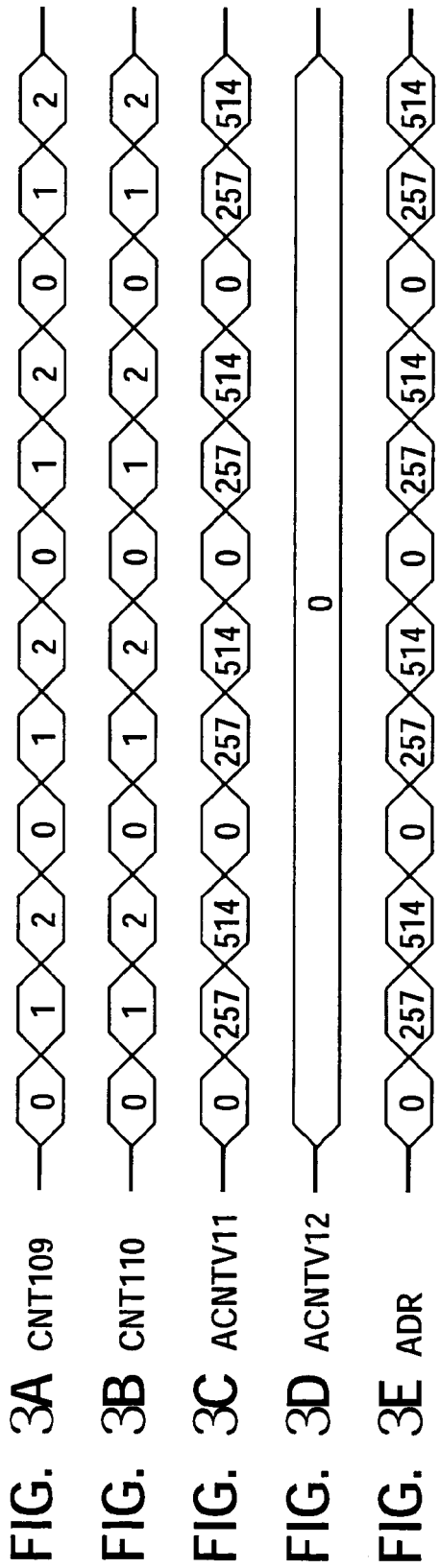
FIGS. 3A to 3E are timing charts for explaining address generation actions when a counter is divided in the address generation apparatus of FIG. 1.

FIG. 3A shows a count value CNT109 of the counter 109, FIG. 3B shows a count value CNT110 of the counter 110, FIG. 3C shows the first address calculation count value ACNTV11 by the counter apparatus 111, FIG. 3D shows the second address calculation count value ACNTV12 by the operation apparatus 113 and FIG. 3E shows the address ADR calculated in the operation apparatus 114 respectively.

The address generation when the counter is divided is performed as the followings.

"0" is stored in the resistor 102 as the initial value of the counter and "1" is stored in the resistor 103 and the resistor 104 as the step value.

The operation apparatus 105 and the operation apparatus 106 perform addition respectively.

The selection apparatus 108 selects the value of the resistor 102 for every three cycles, and selects the value of the operation result of the operation apparatus 106 at the time except for three cycles.

As a result, the count values CNT109 and CNT110 of the counter 109 and the counter 110 take values shown in FIGS. 3A and 3B.

By making it act as mentioned above, the first address calculation count value ACNTV11 and the second address calculation count value ACNTV12 take values shown in FIGS. 3C and 3D.

The operation apparatus 111 performs the following operation by using the output value CNT109 of the counter 109 and the output value CNT110 of the counter 110, and calculates the first address calculation count value ACNTV11.

$$ACNTV11=CNT109+CNT110 \quad \text{(Eq. 3)}$$

The operation apparatus 114 performs the following operation with the first address calculation count value ACNTV11 by the operation apparatus 111 and the second address calculation count value ACNTV12 outputted by the counter apparatus 113, and calculates the address ADR.

$$ADR=ACNTV11+ACNTV12 \quad \text{(Eq. 4)}$$

Note that, the operation performed in the operation apparatus 105 and the operation apparatus 106 may be a common binary operation such as subtraction and multiplication, it is not limited to addition.

It may switch the operation performed in the operation apparatus 111 to an operation shown in the following except for addition by the control signal.

$$ACNTV11=(CNT109<<\text{shift amount})+CNT110 \quad \text{(Eq. 5)}$$

$$ACNTV11=CNT109-CNT110 \quad \text{(Eq. 6)}$$

$$ACNTV11=CNT109*CNT110 \quad \text{(Eq. 7)}$$

In the present first embodiment, it is described as division of the counter, since the carry information is used to widen a range of a computable address calculation count value by using a plurality of operation apparatuses and counters, it can be considered that the case of utilizing it by coupling the counters is a similar action.

As explained above, according to the present first embodiment, the following effect can be obtained, because the address generation apparatus of the present embodiment has the resistors 101 and 102 setting the initial value, the resistors 103 and 104 setting the step value, the operation apparatus 105 performing a predetermined operation such as, for example, addition based on the set value of the resistor 103 and the value fed back from the counter 109 in accordance with the control signal S112 showing a state of the division of the counters from the control apparatus 112 and the signal based on the operation result of the operation apparatus 106, the operation apparatus 106 performing a predetermined operation such as, for example, addition based on the set value of the resistor 104 and the value fed back from the counter 110 in accordance with the control signal S112 showing a state of the division of the counters from the control apparatus 112, the selection apparatus 107 selecting either the set value of the resistor 101 or the output of the operation apparatus 105 based on the not illustrated control signal, the selection apparatus 108 selecting either the set value of the resistor 102 or the output of the operation apparatus 106 based on the not illustrated control signal, the counter 109 setting the count value by the set value (initial value) of the resistor 101 selected by the selector 107 or the value of the operation result of the operation apparatus 105 to make the count value CNT109 to feed back to the operation apparatus 105, the counter 110 setting the count value by the set value (initial value) of the resistor 102 selected by the selector 108 or the value of the operation result of the operation apparatus 106 to make the count value CNT110 feed back to the operation apparatus 106, the operation apparatus 111 operating the count results of the counter 109 and the counter 110 based on the control signal S112 generated by the control apparatus 112 to calculate the first address calculation count value ACNTV11, and the operation apparatus 114 calculating the address ADR based on the first address calculation count value ACNTV11 and the second address calculation count value ACNTV12 that is the count result of the counter apparatus 113 performing the action similar to that of the counter shown in the above.

Namely, the address generation apparatus of the present embodiment can generate a complex address pattern in comparison with a simple address pattern generated by a DSP in the related art.

Further, since the address generation apparatus of the present embodiment is used by dividing the counter, it has an advantage that the influence that the area is enlarged when mounted on an LSI can be suppressed even when an address range is widen and a bit width of the counter is enlarged.

Second Embodiment

Figure 4:
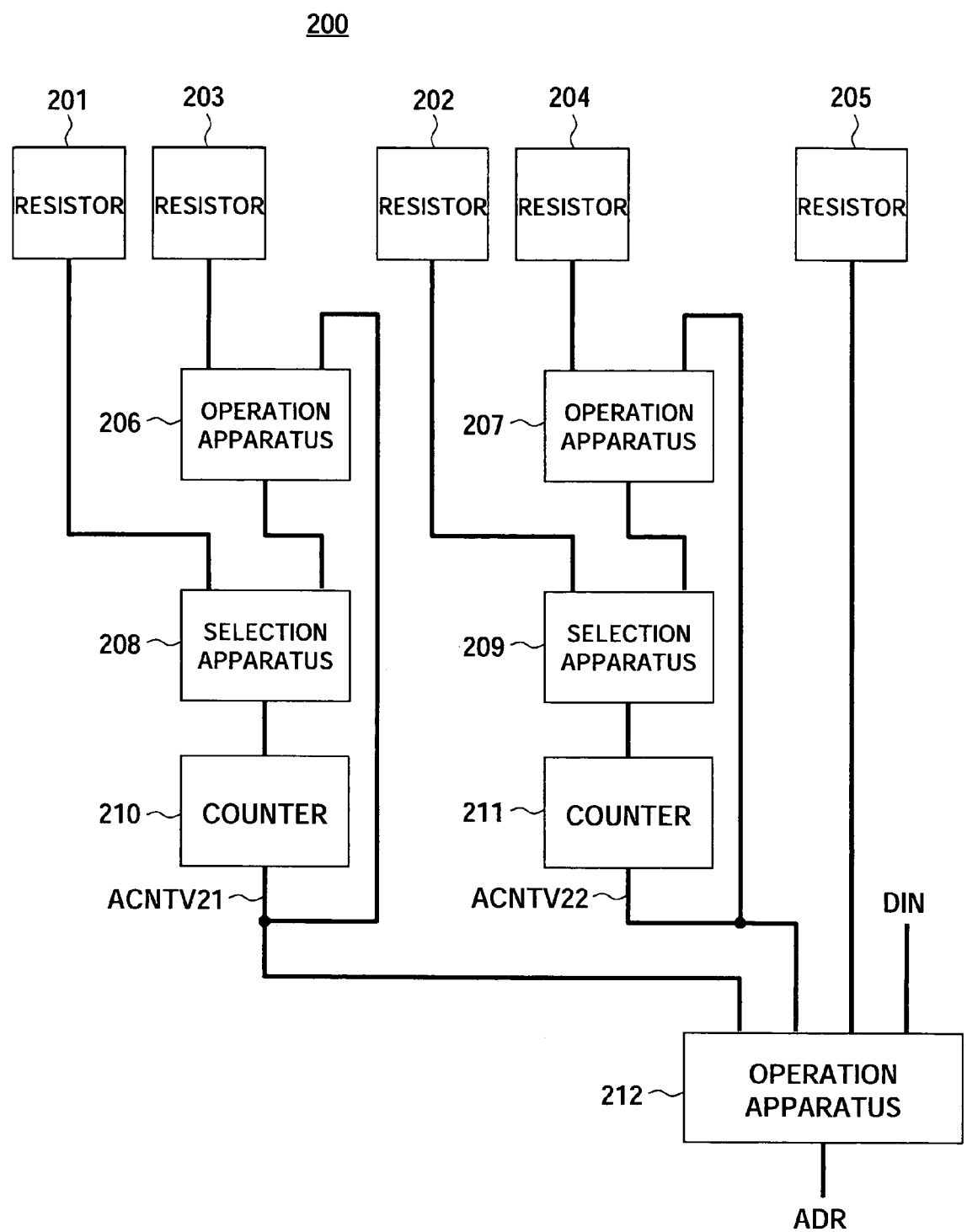
FIG. 4 is a block diagram showing an address generation apparatus according to a second embodiment of the present invention.

FIG. 4 is a block diagram showing an address generation apparatus according to a second embodiment of the present invention.

An address generation apparatus 200 according to the present second embodiment shows a configuration example when generating an address by using an input data.

The address generation apparatus 200 has resistors 201 and 202 for setting an initial value, resistors 203 and 204 for setting a step value, a resistor 205 for setting a constant value, operation apparatuses 206 and 207, selection apparatuses 208 and 209, counters 210 and 211, and an operation apparatus 212.

The operation apparatus 206 performs a predetermined operation such as, for example, addition based on a step value of the resistor 203 and a value fed back from the counter 210, and outputs the operation result to the selection apparatus 208.

The operation apparatus 207 performs a predetermined operation such as, for example, addition based on a step value of the resistor 204 and a value fed back from the counter 211, and outputs the operation result to the selection apparatus 209.

The selection apparatus 208 selects either a set value of the resistor 201 or an output of the operation apparatus 206 based on a not illustrated control signal, and outputs the operation result to the counter 210.

The selection apparatus 209 selects either a set value of the resistor 202 or an output of the operation apparatus 207 based on a not illustrated control signal, and outputs the operation result to the counter 211.

The counter 210 sets a count value by a set value (initial value) of the resistor 201 selected by the selection apparatus 208 or a value of the operation result of the operation apparatus 206, feeds back this value to the operation apparatus 206, and outputs it as a first address calculation count value ACNTV21 to the operation apparatus 212.

The counter 211 sets a count value by a set value (initial value) of the resistor 202 selected by the selection apparatus 209 or a value of the operation result of the operation apparatus 207, feeds back this value to the operation apparatus 207, and outputs it as a second address calculation count value ACNTV22 to the operation apparatus 212.

The operation apparatus 212 performs a predetermined operation based on the first address calculation count value ACNTV21 by the counter 210, the second address calculation count value ACNTV22 by the counter 211, the constant value set in the resistor 205 and an input data DIN depending on a not illustrated control signal.

Here, an address generation action of the address generation apparatus 200 of FIG. 4 will be explained with reference to the timing charts of FIGS. 5A to 5G.

Figure 5:
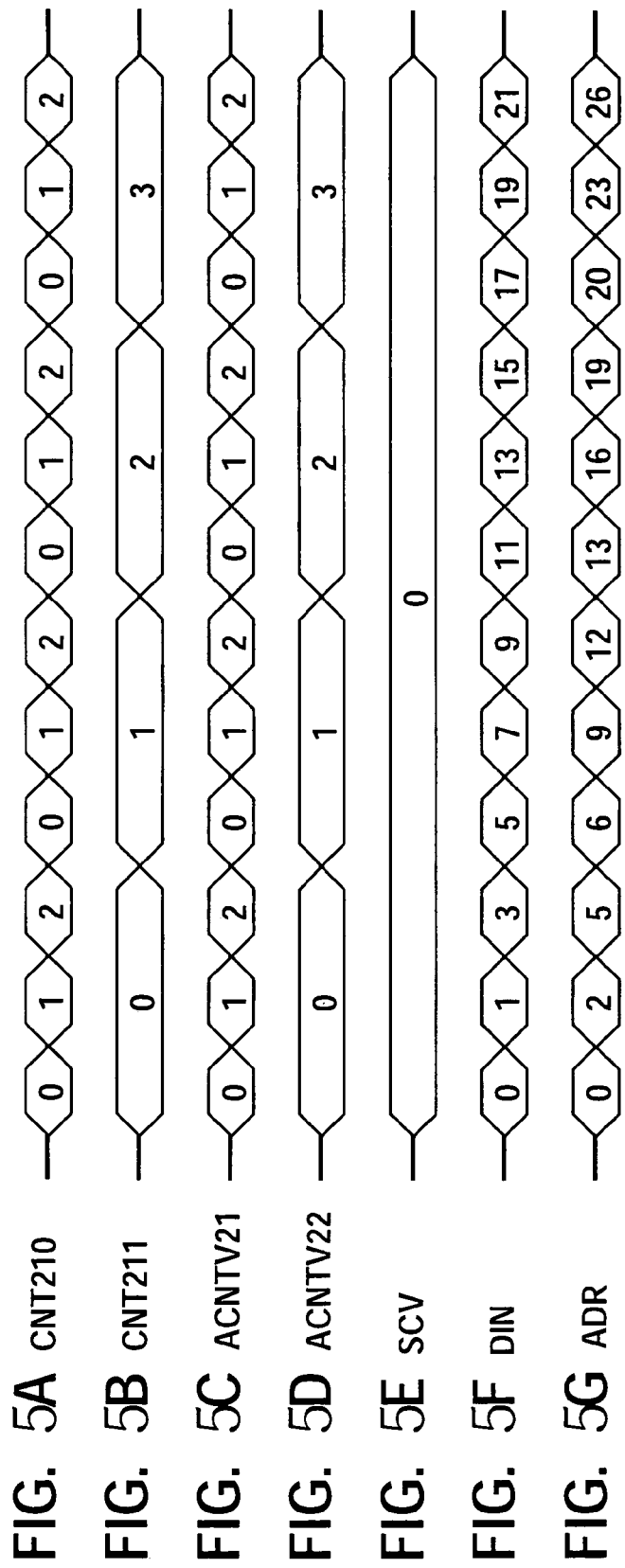
FIGS. 5A to 5G are timing charts for explaining address generation actions of the address generation apparatus of FIG. 4.

FIG. 5A shows a count value CNT210 of the counter 210, FIG. 5B shows a count value CNT211 of the counter 211, FIG. 5C shows the first address calculation count value ACNTV21, FIG. 5D shows the second address calculation count value ACNTV22, FIG. 5E shows the constant value SCV set in the resistor 205, FIG. 5F shows the input data DIN to the operation apparatus 212 and FIG. 5G shows the address ADR calculated in the operation apparatus 212 respectively.

The address generation is performed as the followings.

"0" is stored in the resistor 201 and the resistor 202 as the initial value of the counter, and "1" is stored in the resistor 203 and the resistor 204 as the step value.

The operation apparatus 206 and the operation apparatus 207 perform addition respectively.

The selection apparatus 208 selects the value of the resistor 201 for every three cycles, and selects the value of the operation result of the operation apparatus 206 at the time except for the three cycles.

The selection apparatus 209 selects the value of the operation result of the operation apparatus 207 constantly.

As a result, the count values CNT210 and CNT211 of the counter 210 and the counter 211 take values shown in FIGS. 5A and 5B.

By making it act as mentioned above, the first address calculation count value ACNTV21 and the second address calculation count value ACNTV22 take values shown in FIGS. 5C and 5D.

Further, as shown in FIGS. 5E and 5F, "0" is set in the resistor 205 as the constant value SCV and the operation apparatus 212 is supplied with the input data DIN (0, 1, 3, 5, 7, 9 . . . ) for every cycles.

Then, the operation apparatus 212 performs the following operation and calculates the address ADR.

$$ADR = ACNTV21 + ACNTV22 + SCV + DIN \quad \text{(Eq. 8)}$$

Here, data read out from a memory by using the not illustrated other address generation apparatus and a result that a predetermined operation is performed to the data read out from the memory can be used as the input data.

The operation performed in the operation apparatus 212 may be a common operation such as subtraction and multiplication, it is not limited to addition obviously.

According to the present second embodiment, the address generation apparatus of the present embodiment can generate a complex address pattern in comparison with a simple address pattern generated by a DSP in the related art.

Third Embodiment

Figure 6:
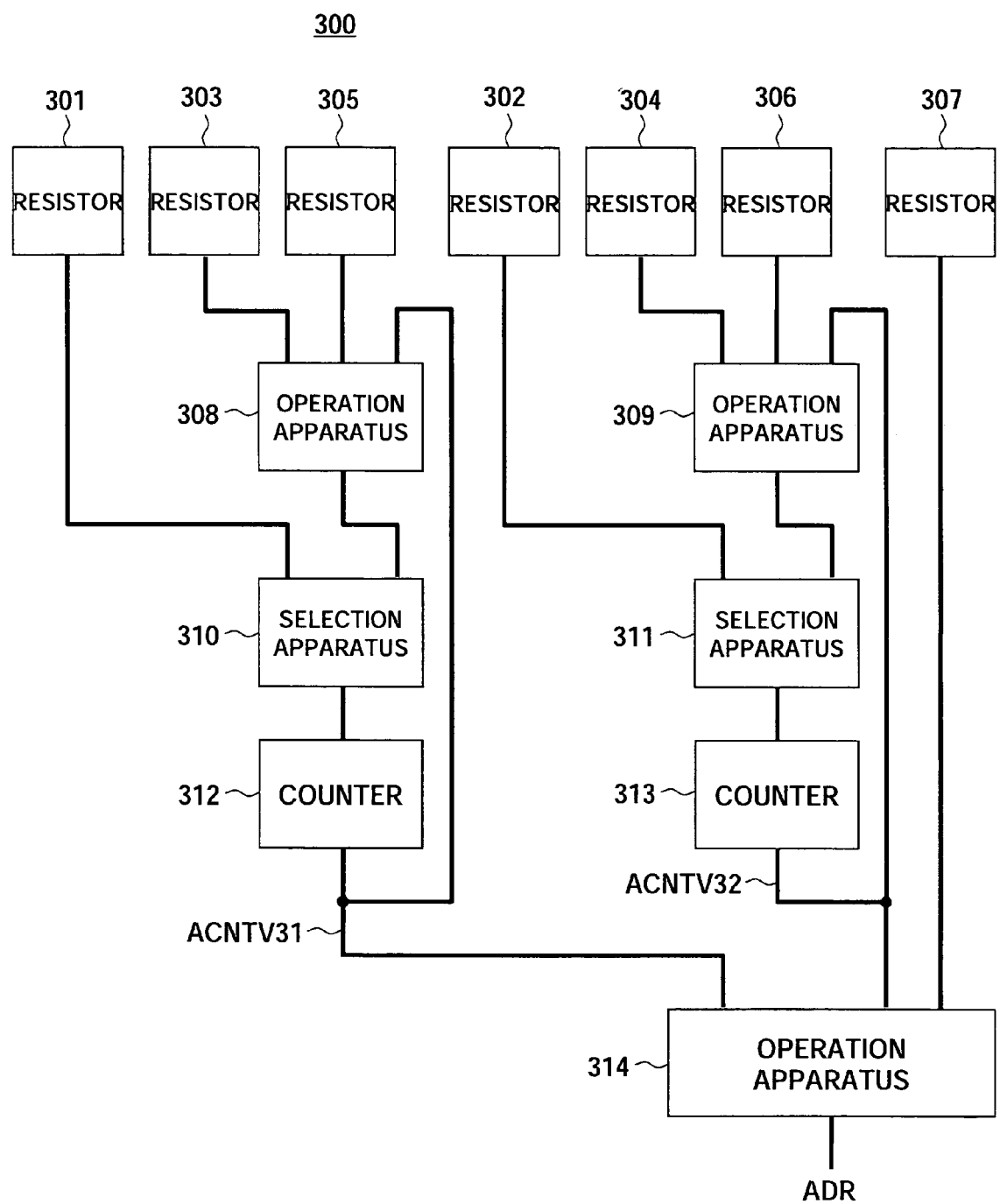
FIG. 6 is a block diagram showing an address generation apparatus according to a third embodiment of the present invention.

FIG. 6 is a block diagram showing an address generation apparatus according to a third embodiment of the present invention.

The address generation apparatus 300 according to the present third embodiment shows a configuration example when generating an address by using a step value, a count value and a modification value.

The address generation apparatus 300 has resistors 301 and 302 for setting an initial value, resistors 303 and 304 for setting a step value, resistors 305, 306 and 307 for setting a modification value, operation apparatuses 308 and 309, selection apparatuses 310 and 311, counters 312 and 313, and an operation apparatus 314.

The operation apparatus 308 performs a predetermined operation such as, for example, addition based on a step value of the resistor 303, a modification value of the resistor 305 and a value fed back from the counter 312, and outputs the operation result to the selection apparatus 310.

The operation apparatus 309 performs a predetermined operation such as, for example, addition based on a step value of the resistor 304, a modification value of the resistor 306 and a value fed back from the counter 313, and outputs the operation result to the selection apparatus 311.

The selection apparatus 310 selects either a set value of the resistor 301 or an output of the operation apparatus 308 based on a not illustrated control signal, and outputs the operation result to the counter 312.

The selection apparatus 311 selects either a set value of the resistor 302 or an output of the operation apparatus 309 based on a not illustrated control signal, and outputs the operation result to the counter 313.

The counter 312 sets a count value by a set value (initial value) of the resistor 301 selected by the selection apparatus 310 or a value of the operation result of the operation apparatus 308, feeds back this value to the operation apparatus 308, and outputs it as a first address calculation count value ACNTV31 to the operation apparatus 314.

The counter 313 sets a count value by a set value (initial value) of the resistor 302 selected by the selection apparatus 311 or a value of the operation result of the operation apparatus 309, feeds back this value to the operation apparatus 309, and outputs it as a second address calculation count value ACNTV32 to the operation apparatus 314.

The operation apparatus 314 performs a predetermined operation based on the first address calculation count value ACNTV31 by the counter 312, the second address calculation count value ACNTV32 by the counter 313 and the modification value set in the resistor 307.

Here, an address generation action of the address generation apparatus 300 of FIG. 6 will be explained with reference to the timing charts of FIGS. 7A to 7D.

Figure 7:
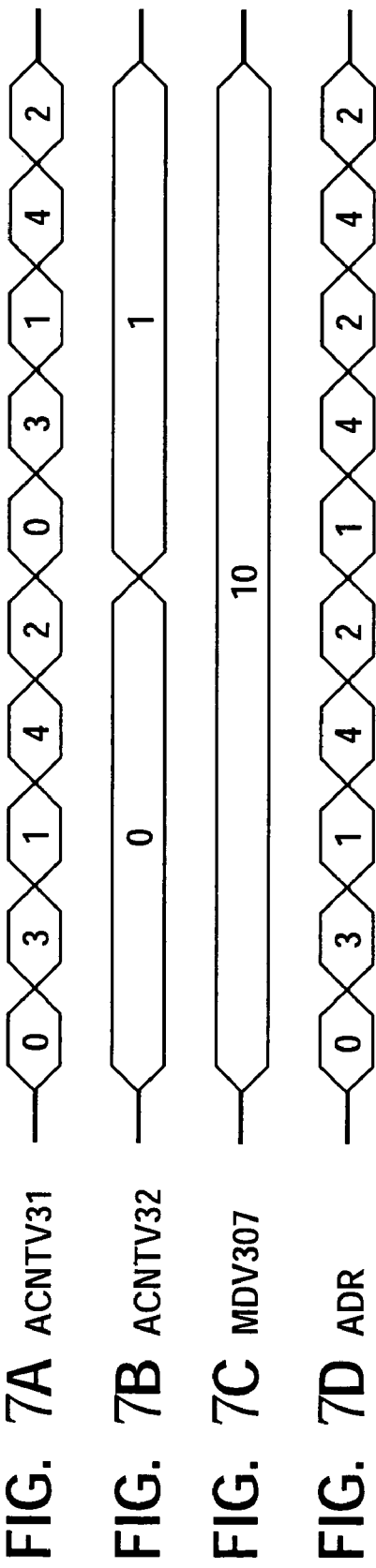
FIGS. 7A to 7D are timing charts for explaining address generation actions of the address generation apparatus of FIG. 6.

FIG. 7A shows the first address calculation count value ACNTV31, FIG. 7B shows the second address calculation count value ACNTV32, FIG. 7C shows the modification value MDV set in the resistor 307, FIG. 7D shows the address ADR calculated in the operation apparatus 314 respectively.

The address generation is performed as the followings.

"0" is stored in the resistor 301 and the resistor 302 as the initial value of the counter, "3" and "1" are stored in the resistor 303 and the resistor 304 as the step value and "5" is stored in the resistor 305 and the resistor 306 as the modification value.

The operation apparatus 308 and the operation apparatus 309 perform the following operations.

$$(STV303 + CNT312) \bmod (MDV305) \quad \text{(Eq. 9)}$$

$$(STV304 + CNT313) \bmod (MDV306) \quad \text{(Eq. 10)}$$

Here, in Equations 9 and 10, STV303 indicates the step value set in the resistor 303, CNT312 indicates the count value of the counter 312, MDV305 indicates the modification value set in the resistor 305, STV304 indicates the step value set in the resistor 304, CNT 313 indicates the count value of the counter 313 and MDV306 indicates the modification value set in the resistor 306. Further, "mod" indicates a modulo operation.

The modulo operation can be realized by performing the following operation when a condition of STV303<MDV305 and INV301<MDV305 is satisfied. Note that, INV301 indicates the initial value set in the resistor 301.

$$STV303 + STV304 - MDV305 \quad \text{(Eq. 11)}$$

The selection apparatus 310 selects the value of the resistor 301 for every five cycles, and selects the value of the operation result of the operation apparatus 308 at the time except for the five cycles.

By making it act as mentioned above, the first address calculation count value ACNTV31 and the second address calculation count value ACNTV32 take values shown in FIGS. 7C and 7D.

Further, as shown in FIG. 7C, "10" is set in the resistor 307 as the modification value 307.

The operation apparatus 314 performs the following operation and calculates the address ADR.

$$ADR=(ACNTV31+ACNTV32)\mathrm{mod}(MDV307) \quad \text{(Eq. 12)}$$

The operation performed in the operation apparatus 314 may be a modulo operation for a common operation such as subtraction and multiplication, it is not limited to the modulo operation for addition.

Further, there are two kinds of input data in the present embodiment, however, it is possible to take a modulo value for an operation of arbitrary combination for an input exceeding two kinds, and to enable the change of them selectively by using the control signal like examples shown in the followings.

$$(\text{input data A+input data B+input data C})$$
$$\text{mod modulo value A} \quad \text{(Eq. 13)}$$

$$(\text{input data A+input data B})$$
$$\text{mod modulo value A+input data C} \quad \text{(Eq. 14)}$$

According to the present third embodiment, the effect similar to that of the above-mentioned second embodiment can be obtained.

Fourth Embodiment

Figure 8:
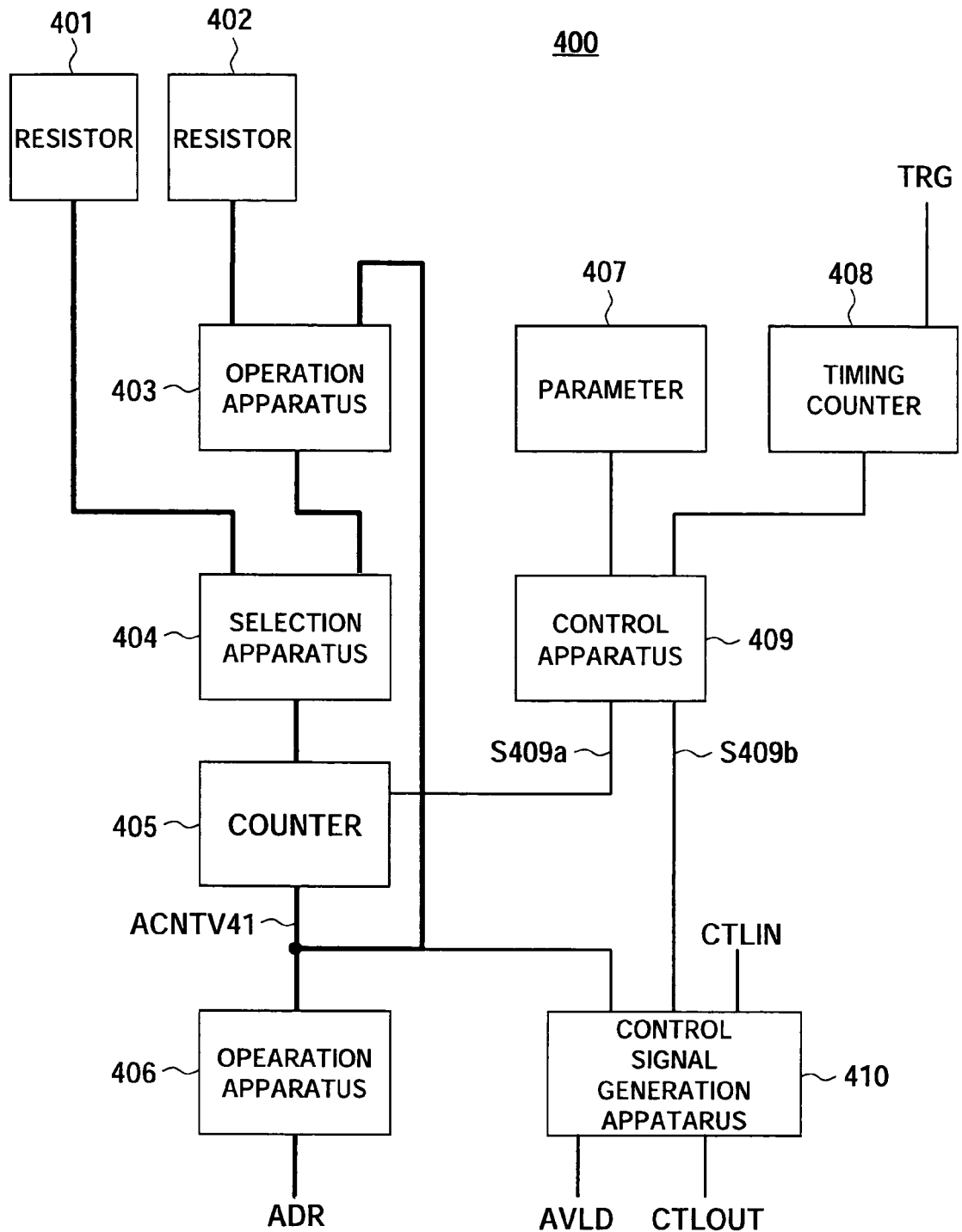
FIG. 8 is a block diagram showing an address generation apparatus according to a fourth embodiment of the present invention.

FIG. 8 is a block diagram showing an address generation apparatus according to a fourth embodiment of the present invention.

The address generation apparatus 400 shows a configuration example when generating an address by changing the start time of address generation.

The address generation apparatus 400 has a resistor 401 setting an initial value, a resistor 402 setting a step value, an operation apparatus 403, a selection apparatus 404, a counter 405, an operation apparatus 406, a parameter resistor 407, a timing counter 408, a control apparatus 409 and a control signal generation apparatus 410. Further, it has a start value TRG and a control input CTLIN as inputs.

The operation apparatus 403 performs a predetermined operation such as, for example, addition based on a step value of the resistor 402 and a value fed back from the counter 405, and outputs the operation result to the selection apparatus 404.

The selection apparatus 404 selects either a set value of the resistor 401 or an output of the operation apparatus 403 based on a not illustrated control signal, and outputs the operation result to the counter 405.

The counter 405 sets a count value by a set value (initial value) of the resistor 401 selected by the selection apparatus 404 or a value of the operation result of the operation apparatus 403, feeds back this value to the operation apparatus 403, and outputs it as a first address calculation count value ACNTV41 to the operation apparatus 406 and the control signal generation apparatus 410.

The counter 405 starts a count up action in response to the control signal S409a by the control apparatus 409.

The operation apparatus 406 performs a predetermined operation based on the first address calculation count value ACNTV41 by the counter 405 based on the not illustrated control signal, and calculates the address ADR.

An address generation delay value is set to the parameter resistor 407 from the external.

The timing counter 408 counts up of the count value when the start value TRG is inputted, and counts the timing for delaying the address generation until the count value becomes to the value set in the parameter resistor 407.

The control apparatus 409 judges whether or not the timing count value CNT408 of the timing counter 408 approaches to the predetermined delay value set in the parameter resistor 407, outputs the control signal 409a to the counter 405 to make the count up of the counter 405 valid when judging that it has approached.

Further, after the timing count value CNT408 of the timing counter 408 has approached to the set value, the control apparatus 409 outputs the control signal S409b to the control signal generation apparatus 410, and controls it to make an address valid signal AVLD valid.

The control signal generation apparatus 410 generates the address valid signal AVLD by the control input CTLIN and this valid state.

The control signal generation apparatus 410 make the address valid AVLD signal valid in response to the control signal s409b by the control apparatus 409. Further, the control signal generation apparatus 410 makes the address valid signal AVLD invalid when the count value of the counter 405, that is, the first address calculation count value ACNTV41 has approached to a predetermined value.

The control signal generation apparatus 410 can be made a control output CTLOUT valid or invalid when the count value of the counter 405 becomes a specific value.

Here, an address generation action of the address generation apparatus 400 of FIG. 8 will be explained with reference to the timing charts of FIGS. 9A to 9G.

Figure 9:
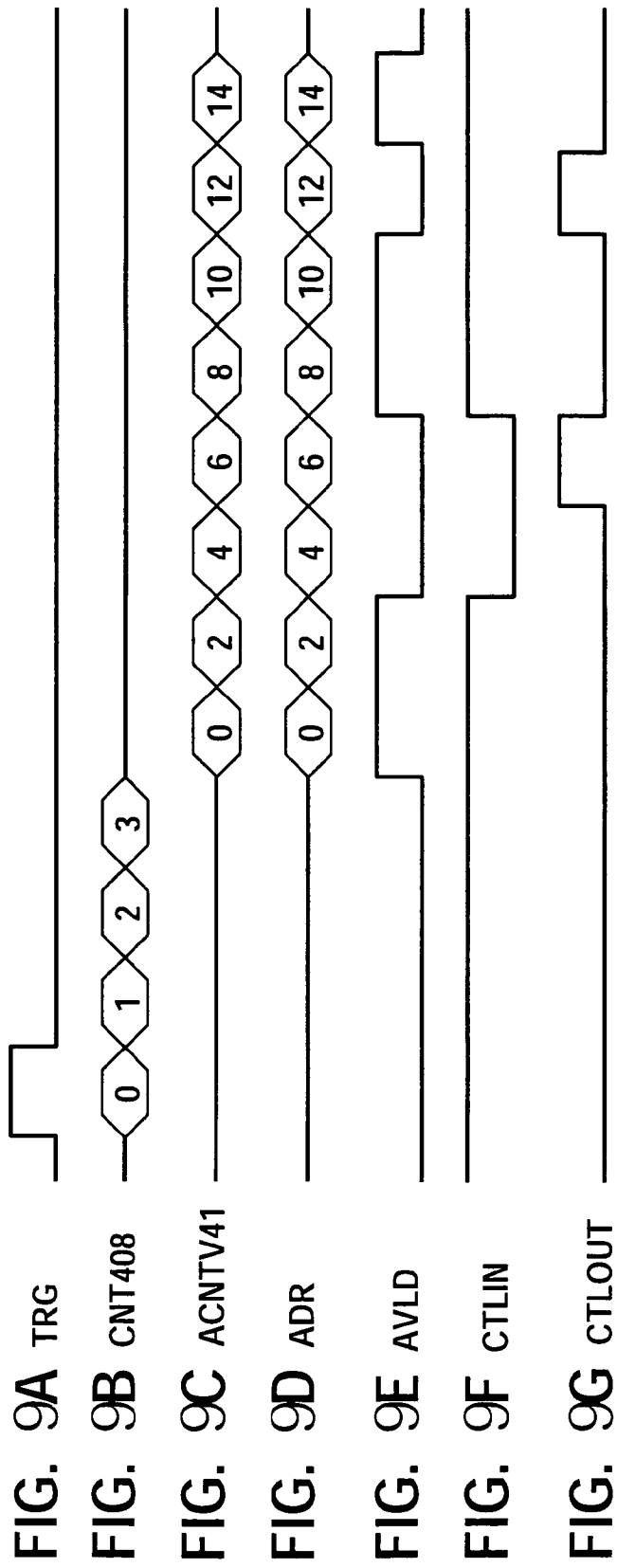
FIGS. 9A to 9G are timing charts for explaining address generation actions of the address generation apparatus of FIG. 8.

FIG. 9A shows the trigger signal TRG given to the timing counter 408, FIG. 9B shows the timing count value CNT408 of the timing counter 408, FIG. 9C shows the first calculation count value ACNTV41 by the counter 405, FIG. 9D shows the address ADR calculated in the operation apparatus 406, FIG. 9E shows the address valid signal AVLD generated in the control signal generation apparatus 410, FIG. 9F shows the control input CTLIN, and FIG. 9G shows the control output CTLOUT respectively.

The address generation is performed as the following.

The address generation delay value "4" is set in the parameter resistor 407, and as shown in FIG. 9A, the count up of the timing counter 408 is performed by the trigger signal TRG inputted from the external.

Then, as shown in FIG. 9B, when the count value CNT408 approaches to the predetermined delay value "4" set in the parameter resistor 407, the control apparatus 409 outputs the control signal S409a so that the address generation counter 405 acts and makes the count up of the counter 405 valid.

"0" is stored in the resistor 401 as the initial value of the counter and "2" is stored in the resistor 402 as the step value. The operation apparatus 403 performs, for example, addition.

The selection apparatus 404 selects the value of the operation apparatus 403 constantly.

By making it act as mentioned above, the first address calculation count value ACNTV41 has a value shown in FIG. 5C.

The operation apparatus 406 calculates the address ADR by using the first address calculation count value ACNTV41.

It can output the address valid signal AVLD and the control output CTLOUT in parallel with the above-mentioned address generation.

As shown in FIGS. 9E to 9G, the address valid signal AVLD is generated by the control apparatus 409 and the control signal generation apparatus 410 based on the control input CTLIN, the trigger signal TRG and the timing count value CNT408.

After the timing count value CNT408 of the timing counter 408 has approached to the set value, the control apparatus 409 makes an address valid signal AVLD valid by the control signal S409b, and when the count value of the counter 405 has approached to an end value, the control apparatus 409 makes the address valid signal AVLD invalid.

The control signal generation apparatus 410 makes the control output CTLOUT valid or invalid when the count value of the counter 405 becomes a specific value.

As shown in FIGS. 9C and 9G, in the present example, when the first address calculation count value ACNTV41 becomes "6" and "12", the control output CTLOUT is made valid.

According to the present fourth embodiment, since the address generation apparatus 400 can output the control signal and the address valid signal together with the address generation, the address generation apparatus 400 has an advantage that the control of a memory and an operation apparatus can be controlled flexibly by using those signals.

Further, since the timing of the address generation can be controlled by the parameter, it is enabled to respond easily when there is a time dependency in reading-out from a plurality of memories and writing.

Fifth Embodiment

Figure 10:
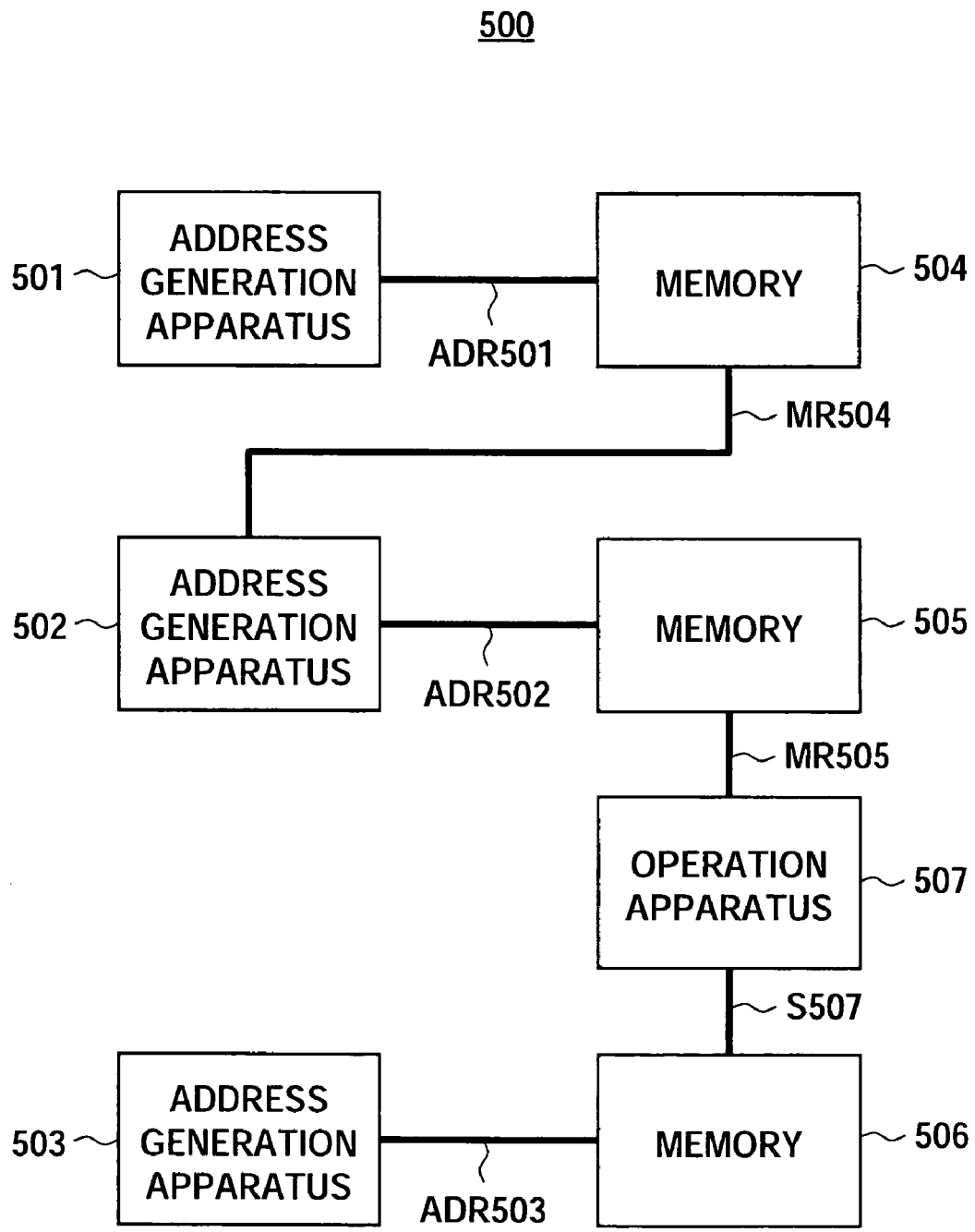
FIG. 10 is a block diagram showing a reconfigurable operation apparatus according to a fifth embodiment of the present invention.

FIG. 10 is a block diagram showing a reconfigurable operation apparatus according to a fifth embodiment of the present invention.

The reconfigurable operation apparatus 500 according to the present fifth embodiment shows a configuration example when an address is generated and an operation is performed by using a memory output as input data of the address generation apparatus.

The reconfigurable operation apparatus 500 has an address generation apparatuses 501, 502 and 503, memories 504, 505 and 506, and an operation apparatus 507.

In the reconfigurable operation apparatus 500 in FIG. 10, an address ADR501 generated by the address generation apparatus 501 is used as an address of the memory 504, an address ADR502 generated by the address generation apparatus 502 is used as an address of the memory 505, and an address ADR503 generated by the address generation apparatus 503 is used as an address of the memory 506.

Readout data of the memory 504 is used as an input data of the address generation apparatus 502. The operation apparatus 507 calculates readout data of the memory 505 and outputs the result to the memory 506.

Figure 11:
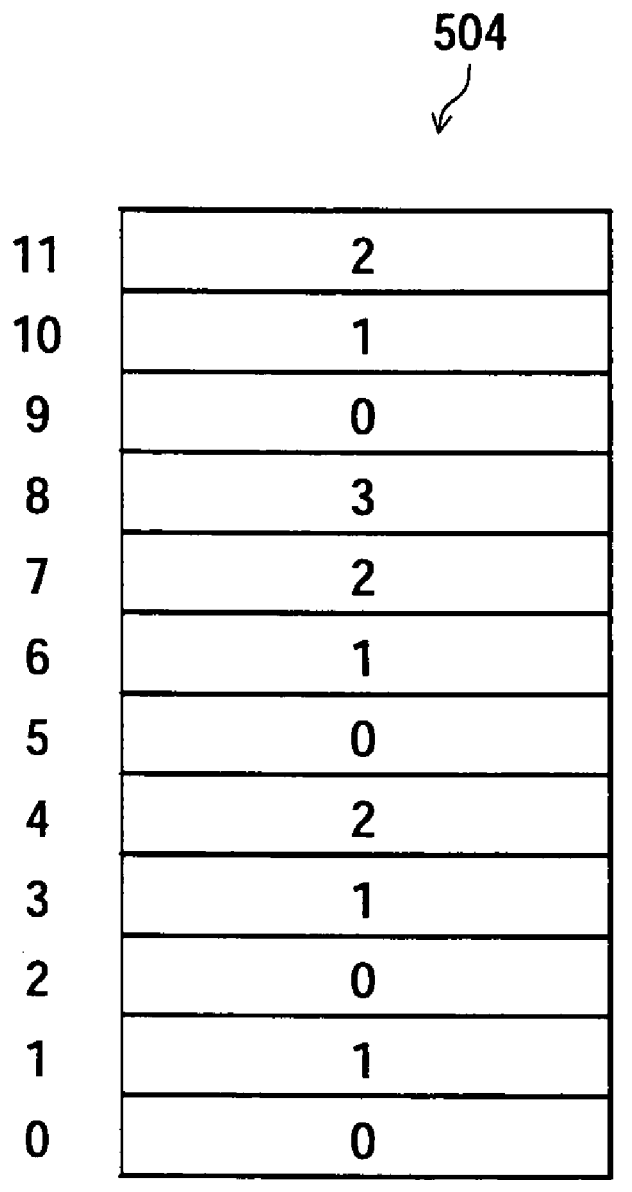

FIG. 11 is a view showing an example of stored data for every address in the memory 504 in FIG. 10.

Further, FIGS. 12A to 12F are timing charts for explaining actions of the operation apparatus 500 of FIG. 10.

Figure 12:
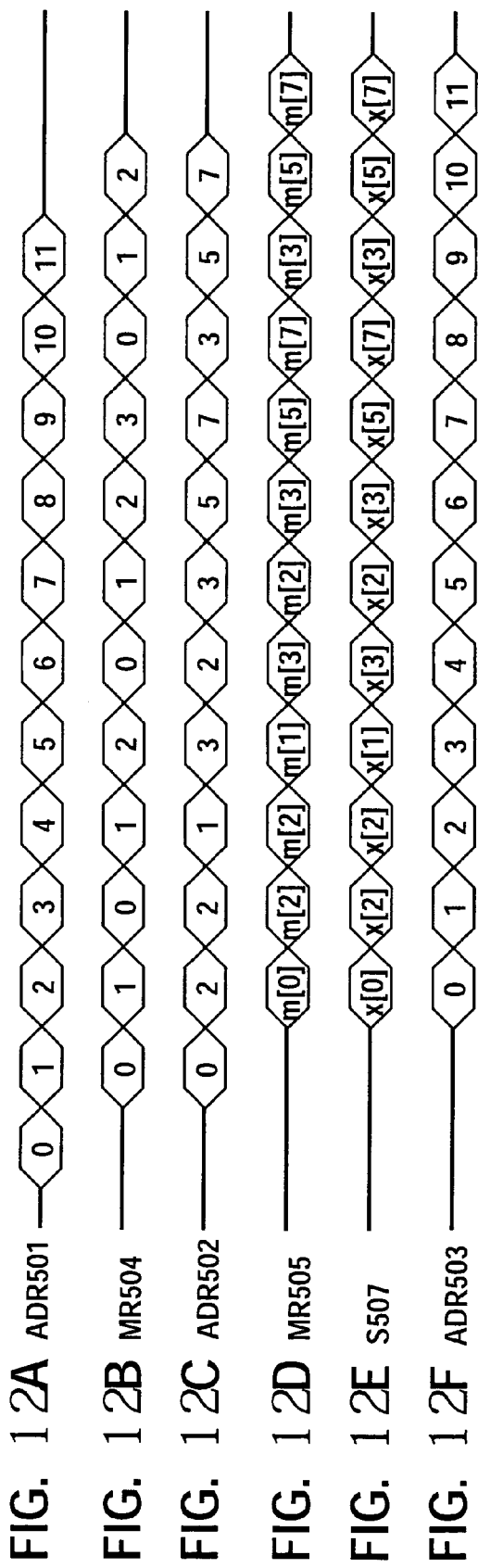
FIGS. 12A to 12F are timing charts for explaining actions of the operation apparatus of FIG. 10.

FIG. 12A shows an address ADR 501 generated by the address generation apparatus 501, FIG. 12B shows an output MR504 of the memory 504, FIG. 12C shows an address ADR502 generated by the address generation apparatus 502, FIG. 12D shows an output MR505 of the memory 505, FIG. 12E shows an output S507 of the operation apparatus 507 and FIG. 12F shows an address ADR 503 generated by the address generation apparatus 503 respectively.

The data is stored in the memory 504 for every address as shown in FIG. 11.

As shown in FIG. 12A, the address generation apparatus 501 issues 0, 1, 2 . . . 11 sequentially as the address ADR501.

Along with that, as shown in FIG. 12B, data 0, 1, 0, 1, 2 . . . is read out from the memory 504.

The address generation apparatus 502 uses the output data from the memory 504 as an input data DIN of the second embodiment of the present invention (FIG. 4), performs the similar action and generates the address ADR 502 as shown in FIG. 12C.

As shown in FIGS. 12D and 12E, an operation {x[i]=m[i]*2} is performed in the operation apparatus 507 for the data m[i] read out from the memory 505, and the result is written into the memory 506. The address supplied to the memory 506 is generated by the address generation apparatus 503 as shown in FIG. 12F.

Note that, in the present fifth embodiment, the operation apparatus 507 is defined as an operation apparatus having one input and one output, however, number of the data of the input and the output is not limited, the similar action can be performed with an operation apparatus having multi-input and multi-output by using the values of the address generation apparatus, the memory or the resistor in response to the corresponding input data and the output data.

Further, the type of the operation is not limited to the operation shown in the example, it is apparent that four arithmetic operations, a logical operation a modulo operation and so on are included.

Sixth Embodiment

Figure 13:
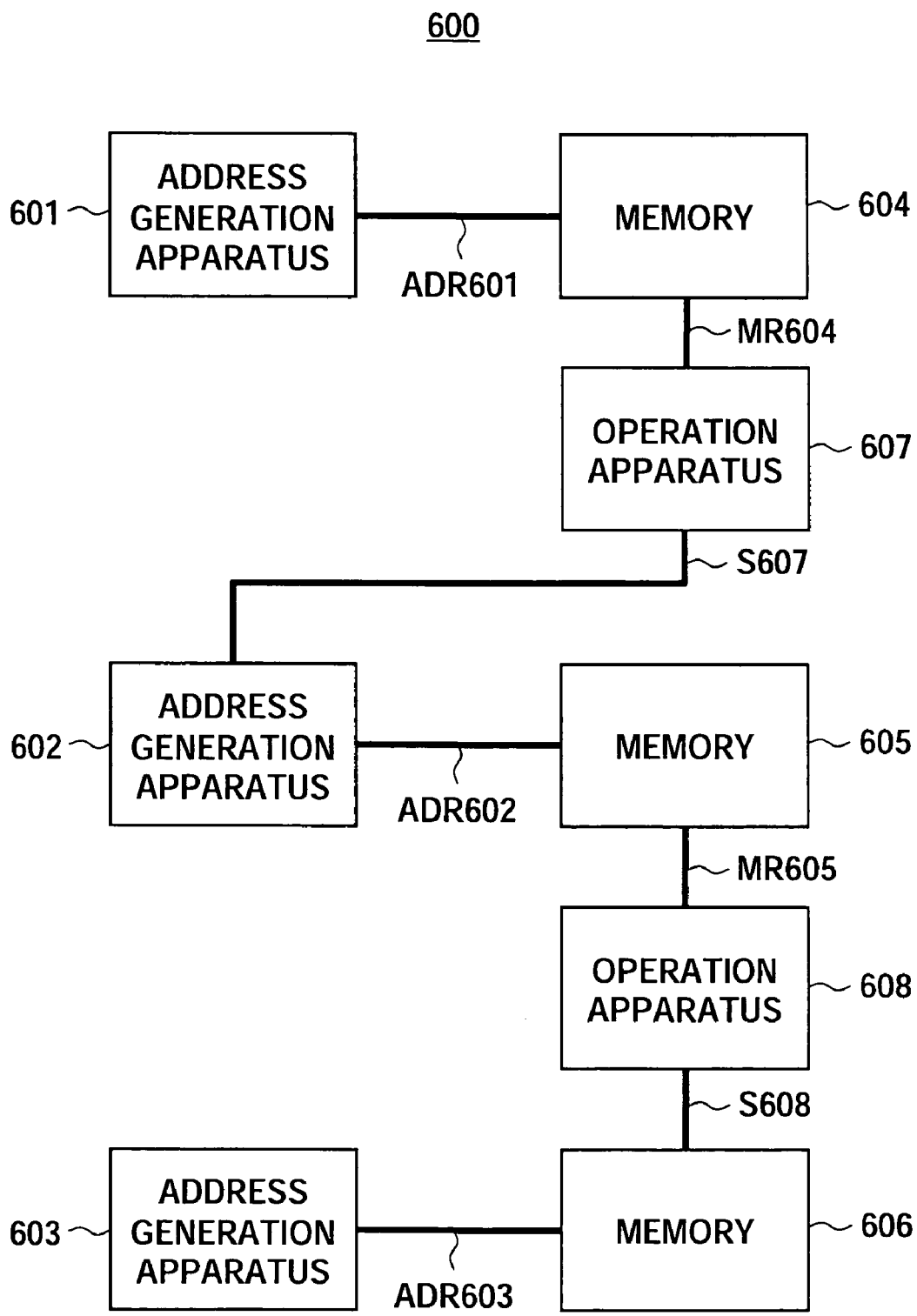
FIG. 13 is a block diagram showing a reconfigurable operation apparatus according to a sixth embodiment of the present invention.

FIG. 13 is a block diagram showing a reconfigurable operation apparatus according to a sixth embodiment of the present invention.

A reconfigurable operation apparatus 600 according to the present sixth embodiment generates shows a configuration when generating an address by using a memory output as an input data of an address generation apparatus and performing an operation.

The reconfigurable operation apparatus 600 has address generation apparatuses 601, 602 and 603, memories 604, 605 and 606 and operation apparatuses 607 and 608.

In the reconfigurable operation apparatus 600 of FIG. 13, an address ADR601 generated by the address generation apparatus 601 is used as an address of the memory 604, an address ADR602 generated by the address generation apparatus 602 is used as an address of the memory 605 and an address ADR603 generated by the address generation apparatus 603 is used as an address of the memory 606.

Read out data of the memory 604 is used as an input data of the operation apparatus 607 and an operation result of the operation apparatus 607 is used as an input data of the address generation apparatus 602. The operation apparatus 608 operates readout data of the memory 605 and outputs the result to the memory 606.

Figure 14:
FIG. 14 is a view showing an example of stored data for every address in the memory of FIG. 13, and FIGS. 15A to 15G are timing charts for explaining actions of the operation apparatus of FIG. 13.

FIG. 14 is a view showing an example of stored data in the memory 604 of FIG. 13 for every address.

Further, FIGS. 15A to 15G are timing charts for explaining actions of the operation apparatus 600 of FIG. 13.

FIG. 15A shows an address ADR 601 generated by the address generation apparatus 601, FIG. 15B shows an output MR604 of the memory 604, FIG. 15 shows an output S607 of the operation apparatus 607, FIG. 15D shows an address ADR 602 generated by the address generation apparatus 602, FIG. 15E shows an output MR605 of the memory 605, FIG. 15F shows an output S608 of the operation apparatus 608, FIG. 15G shows an address ADR603 generated by the address generation apparatus 603.

The data is stored in the memory 604 for every address as shown in FIG. 14.

As shown in FIG. 15A, the address generation apparatus 601 issues 0, 1, 2, ... 11 sequentially as the address ADR601.

Along with that, as shown in FIG. 15B, data 0, 1, 0, 1, 2 ... is read out from the memory 604.

The operation apparatus 607 performs the following operation to the output data MR604 from the memory 604 and supplies it as input data to the address generation apparatus 602.

$$S607 = MR604 \text{ \& } 0x\text{ffffffff} \qquad (\text{Eq. }15)$$

The address generation apparatus 602 uses the operation result output S607 from the operation apparatus 607 as an input data DIN of the second embodiment of the present invention (FIG. 4), performs the similar action and generates the address ADR 602 as shown in FIG. 15D.

As shown in FIGS. 15E and 15F, an operation {x[i]=m[i]*2} is performed in the operation apparatus 608 for the data m[i] read out from the memory 605, and the result is written into the memory 606. The address supplied to the memory 606 is generated by the address generation apparatus 603 as shown in FIG. 15G.

Note that, in the present sixth embodiment, the operation apparatuses 607 and 608 are defined as operation apparatuses having one input and one output, however, number of the data of the input and the output is not limited, the similar action can be performed with an operation apparatus having multi-input and multi-output by using the values of the address generation apparatus, the memory or the resistor in response to the corresponding input data and the output data.

Further, the type of the operation is not limited to the operation shown in the example, it is apparent that four arithmetic operations, a logical operation a modulo operation and so on are included.

As explained above, according to the present embodiment, a complex address pattern can be generated in comparison with a simple address pattern generated by the DSP in the related art.

Further, there is an advantage that the effect that the area is enlarged when mounted on an LSI can be suppressed, even if a bit width of the counter such that an address range is enlarged, by using the counter with divided.

Further, since the control signal and the address effective signal can be outputted together with the address generation, there is an advantage that the control of the memory and the operation apparatus can be performed flexibly by using these signals.

Further, there is an advantage that it is enabled to respond easily when there is a time dependency in reading-out from a plurality of memories and writing, since the timing of the address generation can be controlled by the parameter.

It should be understood by those skilled in the art that various modifications, combinations, sub-combinations and alterations may occur depending on design requirements and other factors insofar as they are within the scope of the appended claims or the equivalents thereof.

What is claimed is:

1. An address generation apparatus that generates a memory address, comprising:
    a plurality of counting sections;
    an address operation section, which produces the memory address from at least one count value from at least one counting section from the plurality of counting sections, in response to a control signal;
    a control section that produces a plurality of control signals having different cycles; and
    wherein at least two operating sections, from the plurality of counting sections, operate using control signals from the control section having different cycles
    wherein each counting section produces a count value, and comprises:
        a counter that produces the count value from a selected value;
        an operation section that produces an operated value from an operation on a step value and the count value from the counter in response to a control signal;
        a selection section that produces the selected value by selecting from either a set value or the operated value.

2. An address generation apparatus as set forth in claim 1, wherein each operation section produces the operated value, based on the step value and the count value from the counter in response to a second control signal.

3. An address generation apparatus as set forth in claim 1,
    the control section produces a first control signal having a first cycle, and a second control signal having a second cycle, the second cycle being 3 times longer than the first cycle; and
    the control signal used by at least one operating section is the first signal; and
    the control signal used by at least one other operating section is the second signal.

4. An address generation apparatus as set forth in claim 1, wherein the address operation section calculates an address count value based on an input value, a set value, and the at least one count value from the at least one counting section.

5. An address generation apparatus as set forth in claim 1, wherein the address operation section calculates an address count value in response to the control signal by using the set value, a modifiable value, and the at least one count value from the at least one counting section.

6. An address generation apparatus that generates a memory address, comprising
    at least one counting section;
    an address operation section, which produces the memory address from at least one count value from the at least one counting section, in response to a control signal;
    a control section that produces a first offset control signal that offsets a start time of the address generation;
    wherein each counting section produces a count value and comprises:
        a counter that produces the count value from a selected value;
        an operation section that produces an operated value from an operation on a step value and the count value from the counter in response to a control signal;
        a selection section that produces the selected value by selecting from either a set value or the operated value.

7. An address generation apparatus as set forth in claim 6, wherein the control section produces an offset control signal that changes a start time of a portion of the counters in a plurality of counting sections.

8. An address generation apparatus as set forth in claim 6, further comprising:
    a parameter resistor for setting an address generation delay value, and
    a timing counter for starting a count in response to a trigger signal and delaying the address generation until the count matches the address generation delay value, wherein
    the control section produces a control signal when the value of the timing counter approaches to the address generation delay value.

9. An address generation apparatus that generates a memory address, comprising:
   at least one counting section;
   an address operation section, which produces the memory address from at least one count value from the at least one counting section, in response to a control signal;
   a control section for defining an operating period of the address generation based on an input of a control signal;
   wherein each counting section produces a count value, and comprises:
      a counter that produces the count value from a selected value;
      an operation section that produces an operated value from an operation on a step value and the count value from the counter in response to a control signal;
      a selection section that produces the selected value by selecting from either a set value or the operated value.

10. An address generation apparatus as set forth in claim 9, comprising a control signal generation section generating an output control signal based on the count value of at least one counter in the at least one counting section.

* * * * *